United States Patent
Lin

(10) Patent No.: US 11,355,484 B2
(45) Date of Patent: Jun. 7, 2022

(54) DISPLAY PANEL COMPRISING MICRO LIGHT-EMITTING DIODES AND A CONNECTION LAYER COMPRISING CONDUCTIVE PARTICLES AND METHOD FOR MAKING SAME

(71) Applicants: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

(72) Inventor: Po-Ching Lin, Chengdu (CN)

(73) Assignees: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

( * ) Notice: Subject to any disclaimer, the term of this patent is extended or adjusted under 35 U.S.C. 154(b) by 0 days.

(21) Appl. No.: 16/837,145

(22) Filed: Apr. 1, 2020

(65) Prior Publication Data
US 2021/0183835 A1 Jun. 17, 2021

(30) Foreign Application Priority Data
Dec. 16, 2019 (CN) .......................... 201911293436.3

(51) Int. Cl.
*H01L 25/16* (2006.01)
*H01L 23/00* (2006.01)
(Continued)

(52) U.S. Cl.
CPC ............ *H01L 25/167* (2013.01); *H01L 24/29* (2013.01); *H01L 24/32* (2013.01); *H01L 24/83* (2013.01);
(Continued)

(58) Field of Classification Search
CPC ......... H01L 24/29; H01L 24/32; H01L 24/83; H01L 25/167; H01L 2224/29311; H01L 2224/29339; H01L 2224/29347; H01L 2224/29313; H01L 33/36–42; H01L 33/63; H01L 33/483; H01L 25/0753;
(Continued)

(56) References Cited

U.S. PATENT DOCUMENTS 6,232,563 B1 * 5/2001 Kim .................. H01L 23/49816
174/261
9,607,727 B2 * 3/2017 Chang ...................... C09J 11/00
(Continued)

*Primary Examiner* — Khiem D Nguyen
(74) *Attorney, Agent, or Firm* — ScienBiziP, P.C.

(57) ABSTRACT

A micro LED display panel includes a substrate, a plurality of first metal electrodes and a plurality of metal pads on a surface of the substrate, a connection layer on the substrate, a plurality of micro LEDs on a side of the connection layer away from the substrate. The connection layer includes conductive particles. Each of the micro LEDs is coupled to at least one of the first metal electrode. A side of each of the metal pads away from the substrate is coupled to some of the conductive particles in the connection layer to form a metal (Continued)

100 retaining wall. The metal retaining walls enhance structural strength of the micro LED display panel and avoid breakage of any of the micro LEDs.

16 Claims, 5 Drawing Sheets

(51) Int. Cl.
*H01L 25/075* (2006.01)
*H01L 33/62* (2010.01)

(52) U.S. Cl.
CPC .......... *H01L 25/0753* (2013.01); *H01L 33/62* (2013.01); *H01L 2224/2929* (2013.01); *H01L 2224/29311* (2013.01); *H01L 2224/29313* (2013.01); *H01L 2224/29339* (2013.01); *H01L 2224/29347* (2013.01); *H01L 2224/32145* (2013.01); *H01L 2224/83862* (2013.01); *H01L 2924/0132* (2013.01); *H01L 2924/0665* (2013.01); *H01L 2933/0066* (2013.01)

(58) Field of Classification Search
CPC ........... H01L 2224/83862; H01L 25/50; H01L 2224/2929; H01L 2924/0132; H01L 2924/0665
USPC .......................................................... 257/88
See application file for complete search history.

(56) References Cited

U.S. PATENT DOCUMENTS

| | | | | |
|---|---|---|---|---|
| 10,193,042 B1* | 1/2019 | Tsai | ..................... | H01L 27/1214 |
| 10,692,923 B2* | 6/2020 | Zhu | .......................... | H01L 24/97 |
| 10,959,337 B2* | 3/2021 | Tanaka | ..................... | H01L 24/29 |
| 2005/0176882 A1* | 8/2005 | Arifuku | ..................... | C09J 4/06 |
| | | | | 524/730 |
| 2009/0115071 A1* | 5/2009 | Karashima | ............... | H01L 24/29 |
| | | | | 257/778 |
| 2013/0210194 A1* | 8/2013 | Bibi | ........................ | H01L 24/95 |
| | | | | 438/107 |
| 2015/0155405 A1* | 6/2015 | Jang | .................. | H01L 31/02327 |
| | | | | 136/256 |
| 2015/0209914 A1* | 7/2015 | Ishigami | .................. | H01B 1/22 |
| | | | | 257/99 |
| 2015/0318257 A1* | 11/2015 | Kim | ........................... | C09J 9/02 |
| | | | | 252/500 |
| 2015/0353781 A1* | 12/2015 | Namiki | .................. | H01L 33/486 |
| | | | | 257/98 |
| 2017/0170049 A1* | 6/2017 | Hu | ....................... | H01L 21/6835 |
| 2017/0188468 A1* | 6/2017 | Hino | ....................... | B23K 35/24 |
| 2018/0171184 A1* | 6/2018 | Aoki | ..................... | C09J 133/08 |
| 2020/0091385 A1* | 3/2020 | Hsieh | ..................... | H01L 33/62 |
| 2020/0235077 A1* | 7/2020 | Jeon | ..................... | H01L 33/0095 |
| 2021/0066243 A1* | 3/2021 | Lee | ..................... | H01L 25/0753 |

* cited by examiner

DISPLAY PANEL COMPRISING MICRO LIGHT-EMITTING DIODES AND A CONNECTION LAYER COMPRISING CONDUCTIVE PARTICLES AND METHOD FOR MAKING SAME

FIELD

The subject matter herein generally relates to a micro light-emitting diode (micro LED) display panel and a method for making the micro LED display panel.

BACKGROUND

Nowadays, micro LED displays are regarded as a new generation of display devices, which have high brightness, low power consumption, ultra-high resolution, and color saturation. However, in manufacturing process of the micro LED displays, the micro light-emitting diode itself may be damaged because it cannot withstand lateral stress or stress from opposite sides of electrodes. Therefore, there is room for improvement in the art.

BRIEF DESCRIPTION OF THE DRAWINGS

Implementations of the present technology will now be described, by way of embodiments only, with reference to the attached figures.

DETAILED DESCRIPTION

Figure 1:
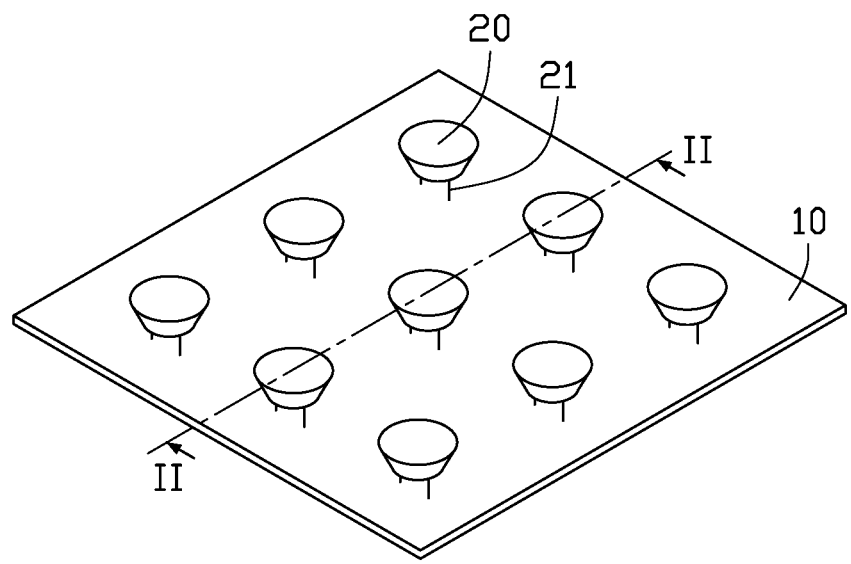
FIG. 1 is an isometric view of a micro light-emitting diode (micro LED) display panel of an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

First Embodiment

FIG. 1 shows a micro LED display panel 100. The micro LED display panel 100 includes a substrate 10 and a plurality of micro LEDs 20 on the substrate 10. The micro LEDs 20 are spaced apart from each other. At least one second metal electrode 21 is positioned on an end of each of the micro LEDs 20 adjacent to the substrate 10. In the present embodiment, the end of each of the micro LEDs 20 adjacent to the substrate 10 is provided with two second metal electrodes 21.

Figure 2:
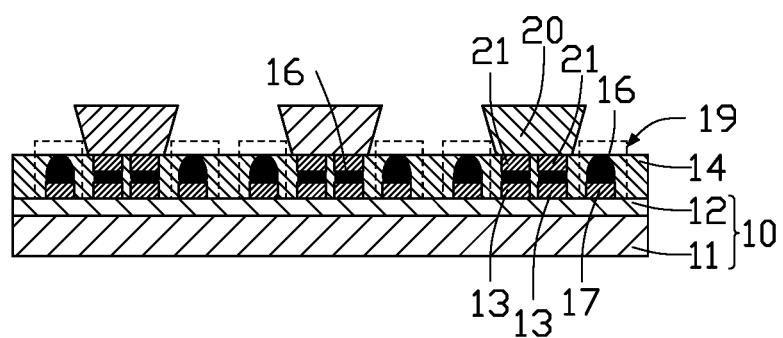
FIG. 2 is a cross-sectional view of a micro LED display panel according to a first embodiment of the present disclosure.

As shown in FIG. 2, a plurality of first metal electrodes 13 is positioned on the substrate 10. Each of the micro LEDs 20 and the second metal electrodes 21 on its end align with and are located above two of the first metal electrodes 13 on the substrate 10.

As shown in FIG. 2, the micro LED display panel 100 further includes a connection layer 14 on the substrate 10. The substrate 10 includes a base layer 11 and a driving layer 12 on the base layer 11. The driving layer 12 includes thin film transistors (not shown), and the driving layer 12 is between the base layer 11 and the connection layer 14. The connection layer 14 is positioned between the driving layer 12 of the substrate 10 and the micro LEDs 20. The second metal electrodes 21 are embedded in the connection layer 14. The connection layer 14 contains solder material including a plurality of conductive particles 16, and each second metal electrode 21 is electrically connected to one of the first metal electrodes 13 by the conductive particles 16. The second metal electrodes 21 and the first metal electrodes 13 are electrically connected in a one-to-one relationship.

The connection layer 14 further contains resin, and the solder material is mixed in the resin. In one embodiment, the resin may be epoxy resin, but is not limited to be the epoxy resin, as long as it can play a role of bonding the substrate 10 and the micro-LEDs 20. In the present embodiment, the conductive particles 16 are anisotropic conductive adhesives. In one embodiment, the conductive particles 16 are made of tin-silver alloy, tin-copper alloy, or tin-bismuth alloy.

The solder material further includes a flux, the flux is used to assist heat conduction and reduce a surface tension of the substrate 10. The flux can also be used to remove films on the surface of the conductive particles 16 and make the conductive particles 16 melt at a specific temperature and move to produce a self-aggregating effect. The conductive particles 16 which have been melted and solidified are positioned between each second metal electrode 21 and one of the first metal electrodes 13 to electrically couple each second metal electrode 21 to one of the first metal electrodes 13. The flux may be ethylene propionic acid, glutaric acid, or glycolic acid.

As shown in FIG. 2, the micro-LED display panel 100 further includes a plurality of metal pads 17 on the substrate 10. The metal pads 17 are positioned on a surface of the substrate 10 having the first metal electrodes 13. The metal pads 17 are also embedded in the connection layer 14. The metal pads 17 are between the micro LEDs 20 and around each of the micro LEDs 20. In the present embodiment, at least two metal pads 17 surround each of the micro LEDs 20.

Each of the metal pads 17 is connected to some of the conductive particles 16 in the connection layer 14, and the conductive particles 16 is connected to a side of each of the metal pads 17 away from the substrate 10. The metal pads 17 and the conductive particles 16 connected to the metal pads 17 are spaced apart from each of the first metal electrodes 13 and each of the micro LEDs 20. Each of the metal pads 17 and the conductive particles 16 connected to the metal pad 17 form a metal retaining wall 19 to effectively enhance a structural strength of the micro LED display panel 100. The metal retaining wall 19 has a height in a thickness direction of the micro LED display panel 100 that is substantially equal to a thickness of the connection layer 14. The metal retaining wall 19 effectively reduces stress upon the micro LED display panel 100 from both sides of the first metal electrodes 13 and avoids breakage of the micro LED display panel 100.

Second Embodiment

Figure 3:
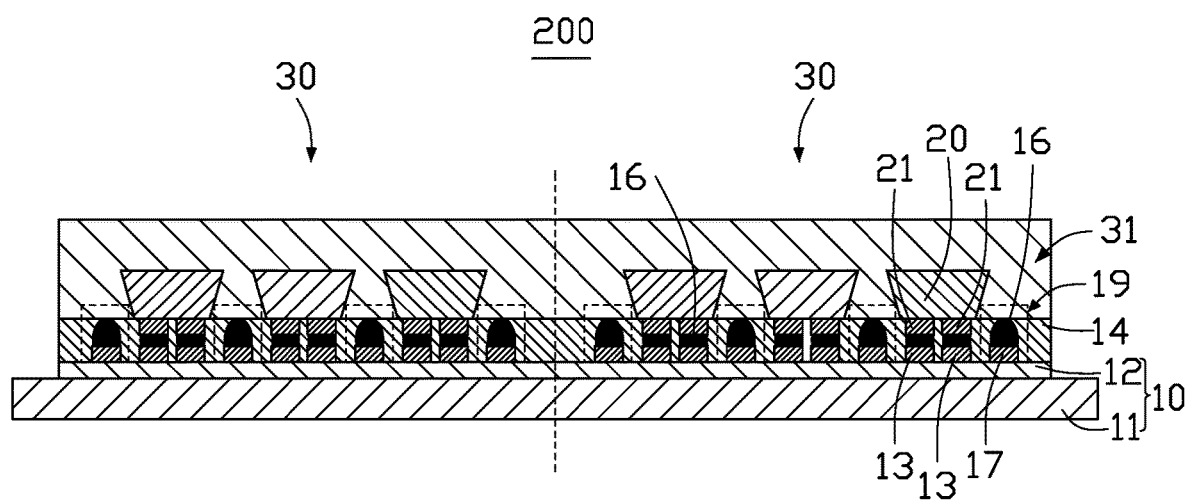
FIG. 3 is a cross-sectional view of a micro LED display panel according to a second embodiment of the present disclosure.

FIG. 3 illustrates a micro LED display panel 200 of the second embodiment. The micro LED display panel 200 has basically the same components as the micro LED display panel 100 in the first embodiment, and also includes a substrate 10, a plurality of micro LEDs 20 on the substrate 10, a connection layer 14 between the substrate 10 and the micro LEDs 20, and a plurality of metal pads 17 and a plurality of first metal electrodes 13 on the substrate 10 and embedded in the connection layer 14.

As shown in FIG. 3, an end of each of the micro LEDs 20 adjacent to the substrate 10 is provided with at least one second metal electrode 21. Each second metal electrode 21 is electrically coupled to one of the first metal electrodes 13 by some conductive particles 16 in the connection layer 14. Some of the conductive particles 16 in the connection layer 14 are connected to a side of each of the metal pads 17 away from the substrate 10, and the metal pads 17 and the conductive particles 16 connected to the metal pads 17 form metal retaining walls 19 spaced apart from each of the first metal electrodes 13 and surrounding each of the micro LEDs 20. The metal retaining walls 19 enhance a strength of the micro LED display panel 200.

As shown in FIG. 3, in this embodiment, three adjacent micro LEDs 20 form a pixel 30, FIG. 3 only schematically shows two pixels 30. The metal pads 17 and the metal retaining walls 19 are provided around each of the micro LEDs 20 in each of the pixels 30. In this embodiment, a distribution of the metal retaining walls 19 on the substrate 10 is different from a distribution of the metal retaining walls 19 on the substrate 10 in the first embodiment. In the present embodiment, one metal pad 17 is located between two adjacent micro LEDs 20 in each of the pixels 30. That is, each of the metal pads 17 is shared by two adjacent micro LEDs 20 in one pixel 30.

As shown in FIG. 3, the micro LED display panel 200 further includes a protective layer 31 on a side of the connection layer 14 away from the substrate 10. The protective layer 31 covers all of the micro LEDs 20, and the protective layer 31 is made of a transparent material blocking water and oxygen.

Third Embodiment

Figure 4:
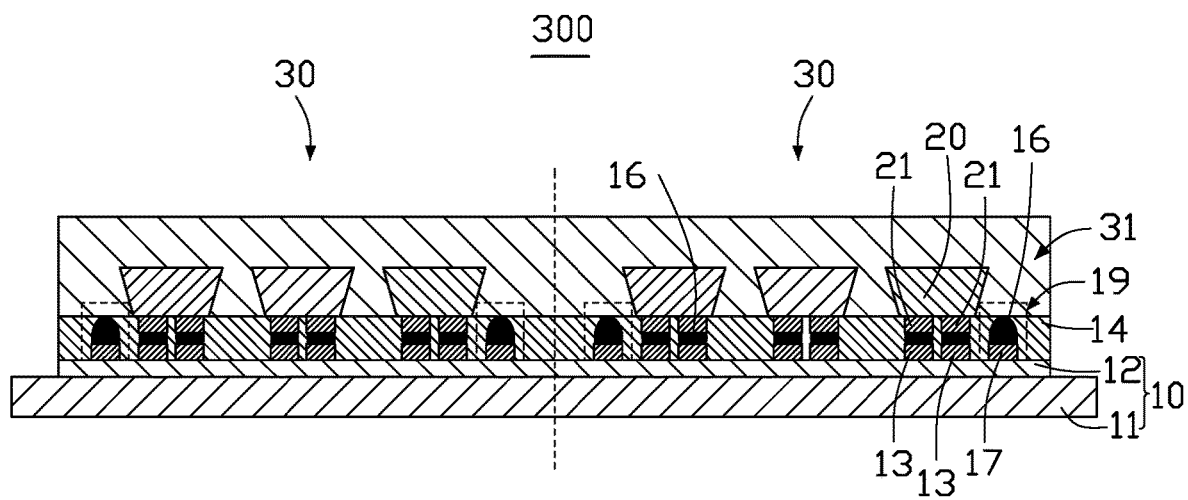
FIG. 4 is a cross-sectional view of a micro LED display panel according to a third embodiment of the present disclosure.

FIG. 4 illustrates a micro LED display panel 300 of the third embodiment. The micro LED display panel 300 has basically the same components as the micro LED display panel 200 in the second embodiment, and also includes a substrate 10, a plurality of micro LEDs 20 on the substrate 10, a connection layer 14 between the substrate 10 and the micro LEDs 20, and a plurality of first metal electrodes 13 and a plurality of metal pads 17 on the substrate 10 and embedded in the connection layer 14.

As shown in FIG. 4, an end of each of the micro LEDs 20 adjacent to the substrate 10 is provided with at least one second metal electrode 21. Each second metal electrode 21 is electrically coupled to one of the first metal electrodes 13 by some conductive particles 16 in the connection layer 14. Some of the conductive particles 16 in the connection layer 14 are connected to a side of each of the metal pads 17 away from the substrate 10, and the metal pads 17 and the conductive particles 16 connected to the metal pads 17 form metal retaining walls 19 spaced apart from each of the first metal electrodes 13.

As shown in FIG. 4, in this third embodiment, three adjacent micro LEDs 20 form a pixel 30, FIG. 4 only schematically shows two pixels 30. In this embodiment, a distribution of the metal retaining walls 19 on the substrate 10 is different from a distribution of the metal retaining walls 19 on the substrate 10 in the second embodiment. In the present embodiment, the metal retaining walls 19 and the metal pads 17 are around each of the pixels 30. The metal retaining walls 19 enhance a strength of the micro LED display panel 300.

Figure 5:
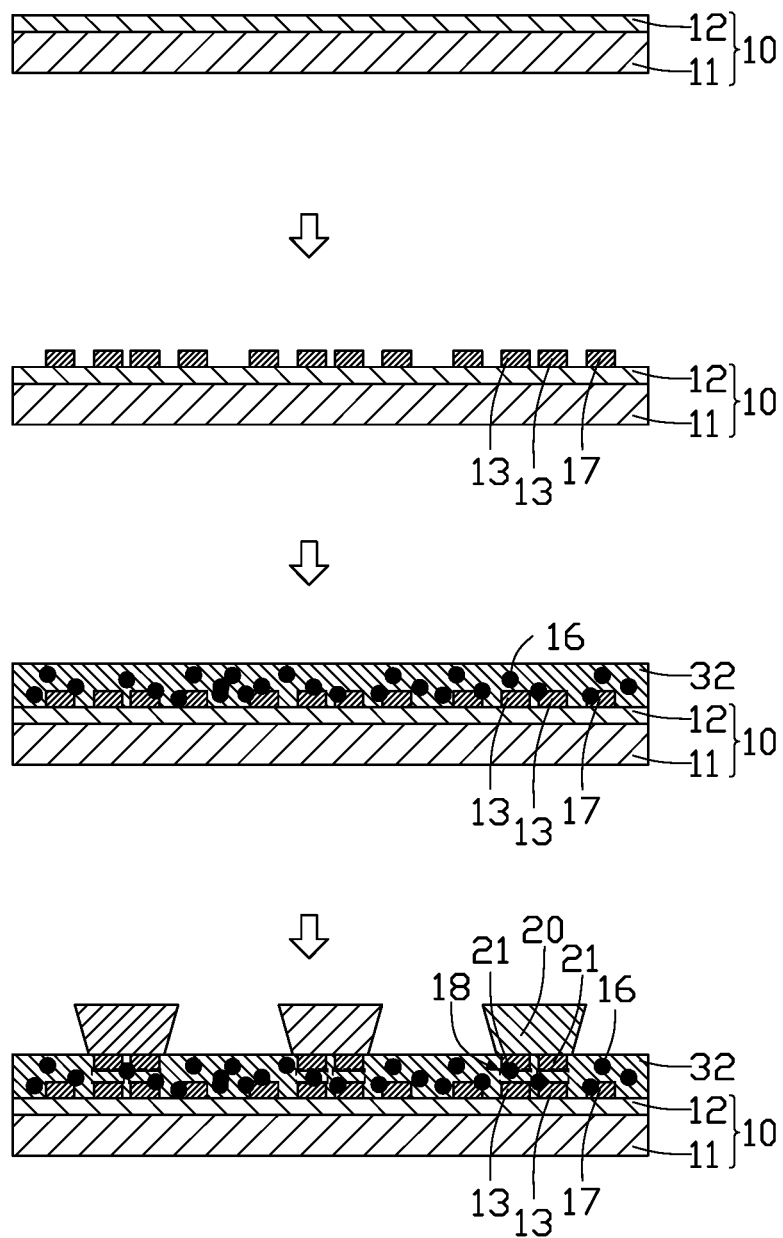
FIG. 5 shows cross-sectional views of steps of manufacturing the micro LED display panel of the first embodiment.

Referring to both FIG. 2 and FIG. 5, a method for making the micro LED display panel 100 includes the following steps.

Step 1: the substrate 10 is provided and the plurality of first metal electrodes 13 and the plurality of metal pads 17 are formed on a surface of the substrate 10. The metal pads 17 are spaced and electrically insulated from each of the first metal electrodes 13.

Step 2: an adhesive layer 32 is formed on the surface of the substrate 10 having the first metal electrodes 13 and the metal pads 17, as shown in FIG. 5. The adhesive layer 32 contains a resin and a solder material. The solder material includes conductive particles 16 and a flux. The conductive particles 16 may be made of tin-silver alloy, tin-copper alloy, or tin-bismuth alloy. The flux promotes heat conduction and reduces a surface tension of the substrate 10. The flux may be ethylene propionic acid, glutaric acid or glycolic acid. The resin may be epoxy resin.

Step 3: the plurality of micro LEDs 20 is provided and installed on a side of the adhesive layer 32 away from the substrate 10, and each of the micro LEDs 20 is aligned with at least one of the first metal electrodes 13. At least one second metal electrode 21 is provided on an end of each of the micro LEDs 20 adjacent to the substrate 10. In the present embodiment, two second metal electrodes 21 are provided on the end of each of the micro LEDs 20 adjacent to the substrate 10, the two second metal electrode 21 are aligned with two first metal electrodes 13.

Step 4: the adhesive layer 32 is cured to form the connection layer 14. In this embodiment, the adhesive layer 32 is cured by heating, and viscosity of the adhesive layer 32 decreases. The conductive particles 16 in the adhesive layer 32 bond with the first metal electrodes 13, the metal pads 17, and the second metal electrodes 21. The conductive particles 16 generate eutectic bonding with each of the first metal electrodes 13, the metal pads 17, and the second metal electrodes 21. In one aspect, a space 18 between each of the first metal electrodes 13 and one second metal electrode 21 is filled with some of the conductive particles 16 to connect each of the first metal electrodes 13 to one second metal electrode 21. On the other hand, each of the metal pads 17 attracts and is connected to some of the conductive particles 16 to form a metal retaining wall 19.

A method in another embodiment for making the micro LED display panel 200 or the micro LED display panel 300 is basically the same as the method for making the micro LED display panel 100, but further includes a step of forming the protective layer 31 on the connection layer 14 to cover all of the micro LEDs 20. The protective layer 31 is transparent and electrically insulating.

The metal pads 17 are provided beside the micro LEDs 20, and the conductive particles 16 melt and move to the first metal electrodes 13 and the metal pads 17 at a specific temperature to generate a metal eutectic bond with the first metal electrodes 13 and the metal pads 17. The conductive particles 16 gather on the metal pads 17, and further form the metal retaining walls 19 beside the micro LEDs 20. The metal retaining walls 19 enhance a strength of the micro LED display panel and avoid the micro LED display panel breaking.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A micro light-emitting diode (micro LED) display panel, comprising:
    a substrate;
    a plurality of first metal electrodes on a surface of the substrate;
    a plurality of metal pads on the surface of the substrate, each of the plurality of metal pads being spaced apart from each of the plurality of first metal electrodes;
    a plurality of micro LEDs on the substrate, each of the plurality of micro LEDs coupled to at least one of the plurality of first metal electrodes; and
    a connection layer on the surface of the substrate and between the substrate and the plurality of micro LEDs; the connection layer covering the plurality of first metal electrodes and the plurality of metal pads, the connection layer comprising conductive particles;
    wherein a side of each of the plurality of metal pads away from the substrate is connected to at least one of the conductive particles in the connection layer, each of the plurality of metal pads and the conductive particles connected to the each of the plurality of metal pads form a metal retaining wall; the metal retaining wall is embedded in the connection layer;
    wherein the metal retaining wall is spaced apart from each of the plurality of micro LEDs and is electrically insulated from each of the plurality of micro LEDs.

2. The micro LED display panel of claim 1, wherein an end of each of the plurality of micro LEDs adjacent to the substrate is provided with at least one second metal electrode, the at least one second metal electrode is electrically coupled to one of the plurality of first metal electrodes by at least one of the conductive particles in the connection layer.

3. The micro LED display panel of claim 1, wherein the plurality of metal pads surrounds each of the plurality of micro LEDs.

4. The micro LED display panel of claim 1, wherein the metal retaining wall has a height in a thickness direction of the micro LED display panel that is equal to a thickness of the connection layer.

5. The micro LED display panel of claim 1, wherein the connection layer further comprises resin, the conductive particles are mixed in the resin.

6. The micro LED display panel of claim 5, wherein the resin is epoxy resin.

7. The micro LED display panel of claim 1, wherein the micro LED display panel comprises a plurality of pixels; adjacent three of the plurality of micro LEDs form one of the plurality of pixels; each of the plurality of pixels is surrounded by some metal retaining walls.

8. The micro LED display panel of claim 1, wherein the conductive particles are made of tin-silver alloy, tin-copper alloy, or tin-bismuth alloy.

9. The micro LED display panel of claim 1, wherein the substrate comprises a base layer and a driving layer on the base layer; the driving layer comprises thin film transistors, and the driving layer is between the base layer and the connection layer.

10. A method for making a micro light-emitting diode (micro LED) display panel, comprising:
    providing a substrate;
    forming a plurality of first metal electrodes and a plurality of metal pads on a surface of the substrate, each of the plurality of metal pads being spaced apart from each of the plurality of first metal electrodes;
    forming an adhesive layer on the surface of the substrate, the adhesive layer comprising conductive particles;
    providing a plurality of micro LEDs and installing the plurality of micro LEDs on a side of the adhesive layer away from the substrate, and aligning each of the plurality of micro LEDs with at least one of the plurality of first metal electrodes;
    curing the adhesive layer wherein at least one of the conductive particles is on each of the plurality of first metal electrodes and at least one of the conductive particles is on each of the plurality of metal pads; wherein each of the plurality of metal pads and the at least one of the conductive particles thereon form a metal retaining wall;
    wherein the metal retaining wall is spaced apart from each of the plurality of micro LEDs and is electrically insulated from each of the plurality of micro LEDs.

11. The method of claim 10, wherein a method of providing the plurality of micro LEDs comprises providing at least one second metal electrode on an end of each of the plurality of micro LEDs, the least one second metal electrode is adjacent to the substrate.

12. The method of claim 11, wherein the adhesive layer comprises a resin and a solder material, the solder material comprising the conductive particles and a flux.

13. The method of claim 12, wherein the resin is epoxy resin.

14. The method of claim 13, wherein a method of curing the adhesive layer comprises curing the adhesive layer by heating.

15. The method of claim 12, wherein the flux is ethylene propionic acid, glutaric acid or glycolic acid.

16. The method of claim 10, wherein a material of the conductive particles comprises tin-silver alloy, tin-copper alloy, or tin-bismuth alloy.

* * * * *